(12) United States Patent
Farooq et al.

(10) Patent No.: US 10,049,979 B2
(45) Date of Patent: Aug. 14, 2018

(54) IC STRUCTURE INCLUDING TSV HAVING METAL RESISTANT TO HIGH TEMPERATURES AND METHOD OF FORMING SAME

(71) Applicant: GLOBALFOUNDRIES INC., Grand Cayman (KY)

(72) Inventors: Mukta G. Farooq, Hopewell Junction, NY (US); Ian D. W. Melville, Highland, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/292,721

(22) Filed: Oct. 13, 2016

(65) Prior Publication Data
US 2018/0108607 A1    Apr. 19, 2018

(51) Int. Cl.
| | |
|---|---|
| *H01L 23/48* | (2006.01) |
| *H01L 23/522* | (2006.01) |
| *H01L 23/528* | (2006.01) |
| *H01L 23/532* | (2006.01) |
| *H01L 21/768* | (2006.01) |

(52) U.S. Cl.
CPC .... *H01L 23/5226* (2013.01); *H01L 21/76841* (2013.01); *H01L 21/76879* (2013.01); *H01L 23/5283* (2013.01); *H01L 23/53238* (2013.01)

(58) Field of Classification Search
CPC ............. H01L 23/5226; H01L 23/5283; H01L 23/53238
USPC .................................................. 257/758, 777
See application file for complete search history.

(56) References Cited

U.S. PATENT DOCUMENTS

| | | | | |
|---|---|---|---|---|
| 6,713,835 B1 * | 3/2004 | Horak | ................ | H01L 21/7682 257/522 |
| 7,786,584 B2 * | 8/2010 | Barth | ................ | H01L 21/76898 257/758 |
| 7,969,006 B2 * | 6/2011 | Lin | ................... | H01L 21/76816 257/758 |
| 8,067,837 B2 * | 11/2011 | Lin | ....................... | H01L 23/528 257/698 |
| 8,686,428 B1 * | 4/2014 | Sekar | ................. | H01L 21/8221 257/173 |
| 8,754,533 B2 * | 6/2014 | Or-Bach | ........... | H01L 21/76254 257/777 |
| 8,884,433 B2 * | 11/2014 | Lin | ................... | H01L 21/76801 257/691 |

(Continued)

OTHER PUBLICATIONS

Zvi Or-Bach, Practical Process Flows for Monolithic 3D, S3S 2013.

(Continued)

*Primary Examiner* — Nitin Parekh
(74) *Attorney, Agent, or Firm* — Yuanmin Cai; Hoffman Warnick LLC

(57) ABSTRACT

An integrated circuit (IC) structure including: a first layer including a first plurality of active devices in a first semiconductor layer over a substrate; a first wiring layer over the first layer; a second layer including a second plurality of active devices within a second semiconductor layer over the first wiring layer; and a second wiring layer over the second layer, wherein the first wiring layer and the second wiring layer each including a first metal resistant to high temperature.

13 Claims, 6 Drawing Sheets

(56) References Cited

U.S. PATENT DOCUMENTS

| | | | |
|---|---|---|---|
| 9,030,029 B2* | 5/2015 | Lin | H01L 23/36 |
| | | | 257/516 |
| 2004/0245637 A1* | 12/2004 | Horak | H01L 21/7682 |
| | | | 257/758 |
| 2006/0289994 A1* | 12/2006 | Greenberg | H01L 23/528 |
| | | | 257/758 |

OTHER PUBLICATIONS

Henning et al., Thermal Considerations for Monolithic Integration of Three-Dimensional Integrated Circuits, 2013.

* cited by examiner

IC STRUCTURE INCLUDING TSV HAVING METAL RESISTANT TO HIGH TEMPERATURES AND METHOD OF FORMING SAME

BACKGROUND

The present disclosure relates to integrated circuit (IC) structures, and more specifically, to an IC structure having stacked active devices including through silicon vias (TSVs) having a metal resistant to high temperatures and a method of forming same.

Integrated circuit structures continue to scale to smaller sizes with increased circuit density within each chip. One approach to continue to decrease chip package size, e.g., from 22 nanometers to 14 nanometers and beyond, employs monolithic three dimensional (3D) structures. Monolithic 3D structures use stacked chips and/or increasing numbers of successive semiconductor layers. In formation of the transistor and other active devices on the various semiconductor layers in monolithic 3D structures, anneals are performed to activate the devices, e.g., to diffuse dopants on the semiconductor layers. As the IC structures are formed, back-end-of-line (BEOL) and far BEOL (FBEOL) copper interconnects are formed over the active devices to scale the wiring. One limitation to continued use of monolithic 3D structures is that the anneals necessary to activate active devices in the various semiconductor layers ideally use temperatures above 400° C., which can also damage previously formed BEOL and FBEOL interconnect structures. Approaches to address this challenge employ laser annealing to activate active devices in the semiconductor layers, and shield layers to protect other interconnect layers. The use of the shield layers increases costs and process time.

SUMMARY

A first aspect of the disclosure is directed to an integrated circuit (IC) structure, including: a first layer including a first plurality of active devices in a first semiconductor layer over a substrate; a first wiring layer over the first layer; a second layer including a second plurality of active devices within a second semiconductor layer over the first wiring layer; and a second wiring layer over the second layer, wherein the first wiring layer and the second wiring layer each including a first metal resistant to high temperature.

A second aspect of the disclosure includes a method, including: forming a first layer having a first plurality of active devices within a first semiconductor layer over a substrate; forming a first wiring layer over the first layer, the first wiring layer including a first metal resistant to high temperature; forming a second layer including a second plurality of active devices within a second semiconductor layer over the first wiring layer; and forming a second wiring layer over the second layer, the second wiring layer including the first high temperature resistant metal.

A third aspect of the disclosure is related to an integrated circuit (IC) structure, including: a first layer including a first plurality of active devices in a first semiconductor layer over a substrate; a first wiring layer over the first layer including a first metal resistant to high temperature; a second layer including a second plurality of active devices within a second semiconductor layer over the first wiring layer; a second wiring layer over the second layer including the first metal resistant to high temperature, wherein the first metal resistant to high temperature includes at least one of: tungsten, cobalt, rhodium, iridium, nickel, ruthenium, tantalum, niobium, graphite, or platinum; a back-end-of-the-line (BEOL) metallization over the second wiring layer; a first through silicon via (TSV) extending from the BEOL metallization to the first wiring layer; a second TSV extending from the BEOL metallization to the second wiring layer.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

The present disclosure relates to integrated circuit (IC) structures, and more specifically, to an IC structure having stacked active devices including through silicon vias (TSVs) and a method of forming same. The active devices of the IC structure may include a high temperature metal instead of conventional low temperature metals, e.g., copper. The use of high temperature metals for interconnections within the active device layers results in high temperature resistant wiring that does not or very minimally damages during annealing. TSVs may be formed after annealing using any metal, including a low temperature metal. However, because the annealing is performed prior to TSV formation, the low temperature metal of the TSV is not damaged.

Figure 1:
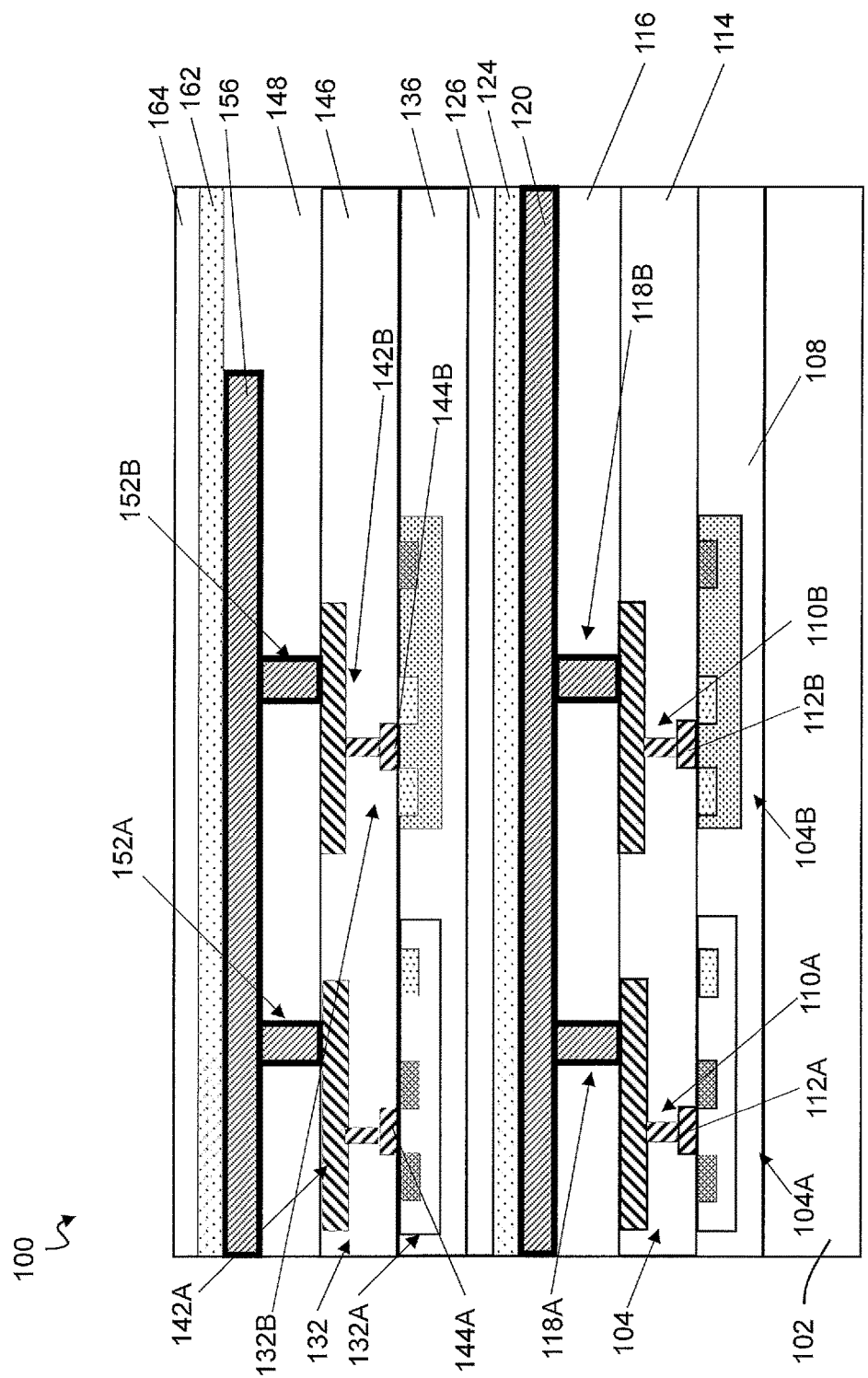
FIGS. 1-2 show cross-sectional views of steps of a method of forming an IC structure according to embodiments of the disclosure, with FIG. 2 showing the resulting IC structure according to embodiments of the disclosure.
Figure 2:
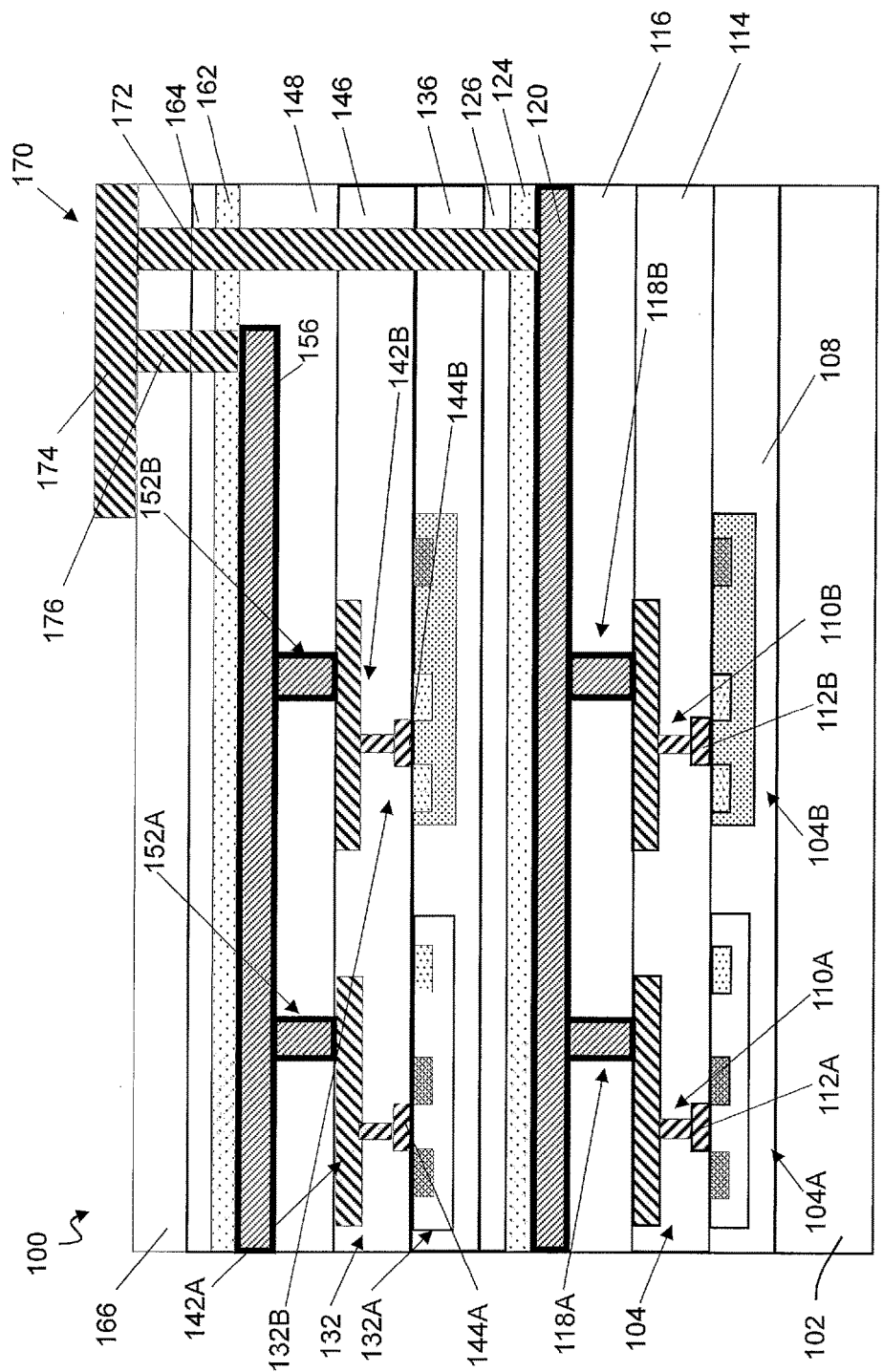

FIGS. 1-2 show cross-sectional views of steps of a method of forming an IC structure according to embodiments of the disclosure, with FIG. 2 showing the resulting IC structure 190 according to embodiments of the disclosure.

FIG. 1 shows a preliminary IC structure 100 including a semiconductor substrate 102 upon which fabrication of active devices according to embodiments of the disclosure will be fabricated. Semiconductor substrate 102 may include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate 102 may be strained. While substrate 102 includes a single layer of semiconductor material, it is emphasized that the teachings of the disclosure are equally applicable to semiconductor-on-insulator (SOI) substrates.

FIG. 1 also shows forming a first plurality of active devices 104 on semiconductor substrate 102. Active devices 104 may include any now known or later developed semiconductor device such as but not limited to: transistors and other logic structures, memory cells, resistors, etc. As illustrated, one active device 104A includes an n-type field effect transistor (NFET) and another active device 104B includes a p-type field effect transistor (PFET). While two transistors 104A, 104B have been illustrated, it is understood that a large number of transistors or other active devices may be formed without departing from aspects of the disclosure described herein. With the exception of when activation anneal(s) are performed, transistors 104A, 104B or other active devices may be formed on substrate 102 using any now known or later developed semiconductor fabrication techniques, e.g., deposition, photolithographic patterning, etching, planarization, dopant implants, etc. Transistors 104A, 104B are shown formed in an epitaxial semiconductor layer 108 atop substrate 102 according to conventional processes front-end-of-the-line (FEOL) processing, but may be formed in a variety of alternative fashions on or within substrate 102.

Still referring to FIG. 1, a dielectric layer 114 may be formed, e.g., deposited, over semiconductor layer 108. Dielectric layer 114 may include, for example, at least one of: an oxide, e.g., silicon oxide, or a nitride, e.g., silicon nitride. Active gates 112A, 112B and contacts, such as gate contacts 110A, 110B, may be formed through dielectric layer 114 to a gate 112A, 112B of each transistor 104A, 104B, respectively. Gate contacts 110A, 100B may be formed by, for example, etching a trench (not shown) in dielectric layer 114 to expose gate 112A, 112B of each transistor 104A, 104B, and filling the trench, e.g., by deposition, with a conductive metal and planarizing the conductive metal. Optionally, a conductive liner can be deposited within the trench before deposition of the conductive metal so that the trench is lined with the conductive metal.

As used herein, "etching" generally refers to the removal of material from a substrate or structures formed on the substrate by wet or dry chemical means. In some instances, it may be desirable to selectively remove material from certain areas of the substrate. In such an instance, a mask may be used to prevent the removal of material from certain areas of the substrate. There are generally two categories of etching, (i) wet etch and (ii) dry etch. Wet etching may be used to selectively dissolve a given material and leave another material relatively intact. Wet etching is typically performed with a solvent, such as an acid. Dry etching may be performed using a plasma which may produce energetic free radicals, or species neutrally charged, that react or impinge at the surface of the wafer. Neutral particles may attack the wafer from all angles, and thus, this process is isotropic. Ion milling, or sputter etching, bombards the wafer with energetic ions of noble gases from a single direction, and thus, this process is highly anisotropic. A reactive-ion etch (RIE) operates under conditions intermediate between sputter etching and plasma etching and may be used to produce deep, narrow features, such as trenches.

As used herein, "depositing," "deposition," etc., may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Planarization refers to various processes that make a surface more planar (that is, more flat and/or smooth). Chemical-mechanical-polishing (CMP) is one currently conventional planarization process which planarizes surfaces with a combination of chemical reactions and mechanical forces. Other currently conventional planarization techniques may include: (i) oxidation; (ii) chemical etching; (iii) taper control by ion implant damage; (iv) deposition of films of low-melting point glass; (v) resputtering of deposited films to smooth them out; (vi) photosensitive polyimide (PSPI) films; (vii) new resins; (viii) low-viscosity liquid epoxies; (ix) spin-on glass (SOG) materials; and/or (x) sacrificial etch-back.

Further, another dielectric layer 116 may be formed, e.g., deposited, over dielectric layer 114. Dielectric layer 116 may include, for example, at least one of: an oxide, e.g., silicon oxide, or a nitride, e.g., silicon nitride.

Additionally, vias 118A, 118B may be formed within dielectric layer 116 and to provide connection between a respective transistor 104A, 104B of the plurality of active devices 104 and a wiring layer 120 formed over semiconductor layer 108. More specifically, vias 118A, 118B may provide connection between contacts 110A, 110B and wiring layer 120. Vias 118A, 118B can include a metal resistant to high temperature. As used herein, a metal resistant to high temperature includes a metal having a metaling point greater than approximately 1400° C. The metal that is resistant to high temperature may include, for example, at least one of: tungsten, cobalt, rhodium, iridium, nickel, ruthenium, tantalum, niobium, graphite, or platinum. Vias 118A, 118B can be formed by etching a trench (not shown) within dielectric layer 116 to expose gate contacts 110A, 110B. The trench may be filled with the metal resistant to high temperature. Additionally, the metal resistant to high temperature may be planarized to a top surface of dielectric layer 116.

Wiring layer 120 may be formed, e.g., via deposition, over semiconductor layer 108, or more specifically, over dielectric layer 116, and over vias 118A, 118B such that wiring layer 120 is electrically connected to vias 118A, 118B. In another embodiment, wiring layer 120 may be formed at the same time as vias 118A, 118B, and therefore, in some embodiments, may be composed of the same material as the material used for vias 118A, 118B. Thus, wiring layer 120 may also include a metal resistant to high temperature such as, for example, at least one of: tungsten, cobalt, rhodium, iridium, nickel, ruthenium, tantalum, niobium, graphite, or platinum. Further, an anneal may be performed after the formation of vias 118A, 118B and/or after formation of wiring layer 120 to activate plurality of active devices 104. Since vias 118A, 118B and wiring layer 120 are composed of metal resistant to high temperature, vias 118A, 118B and wiring layer 120 are not damaged during the anneal that activates plurality of active devices 104. That is, in contrast to conventional contacts and wiring layers which use, copper, the present disclosure provides for the use of a metal resistant to high temperatures, e.g., tungsten. Thus, the activation anneal(s) can occur without regard to limitations on temperatures that could damage vias 118A, 118B and wiring layer 120. Due to the higher melting points of the high temperature resistant metal, the temperature and time constraints on the anneal used to activate plurality of active devices 104 are reduced and the anneal can be performed at higher temperatures and for longer durations without damaging vias 118A, 118B and wiring layer 120. Temperatures, therefore, can exceed those that would normally damage BEOL interconnect structures, e.g., they may exceed 900° C. and even exceed 1000° C. In contrast to conventional techniques, no shielding layers are necessary to perform the anneals, thus saving on costs and process time.

After forming wiring layer 120, a dielectric layer 124 may be formed over wiring layer 120. Dielectric layer 124 may include any appropriate interlayer dielectric material such as but not limited to: silicon nitride ($Si_3N_4$) or silicon oxide ($SiO_2$). Further, a crystalline silicon layer 126 may be formed over dielectric layer 124. Dielectric layer 124 and crystalline silicon layer 126 may each be formed by conventional deposition techniques.

Still referring to FIG. 1, the process described herein may be repeated to form a second layer having a second plurality of active devices over semiconductor layer 108 including first active devices 104 to create a stacked IC structure 100. For example, a second plurality of active devices 132 may be formed according to conventional processes FEOL processing within another epitaxial semiconductor layer 136 over crystalline silicon layer 126. Active devices 132 may include any now known or later developed semiconductor device such as but not limited to: transistors and other logic structures, memory cells, resistors, etc. As illustrated, one active device 132A includes an NFET and another active device 132B includes a PFET. While two transistors 132A, 132B have been illustrated, it is understood that a large number of transistors or other active devices may be formed without departing from aspects of the disclosure described herein. With the exception of when activation anneal(s) are performed according to embodiments of the disclosure, transistors 132A, 132B or other active devices may be formed using any now known or later developed semiconductor fabrication techniques, e.g., deposition, photolithographic or sidewall transfer patterning, etching, planarization, dopant implants, etc. Transistors 132A, 132B are shown formed in an epitaxial semiconductor layer 136 atop crystalline silicon layer 126, but may be formed in a variety of alternative fashions.

First plurality of active devices 104 and second plurality of active devices 132 do not need to be identical, and may be different in size (e.g., 22 nm versus 10 nm) and/or type, i.e., different active devices such as transistors and memory cells. That is, first plurality of active devices 104 may have at least one of a different size and a different type than second plurality of active devices 132.

Still referring to FIG. 1, a dielectric layer 146 may be formed, e.g., deposited over semiconductor layer 136. Dielectric layer 146 may include, for example, at least one of: an oxide, e.g., silicon oxide, or a nitride, e.g., silicon nitride. Active gates 144A, 144B and contacts, such as gate contacts 142A, 142B, may be formed to a gate 144A, 144B of each transistor 132A, 132B, respectively. Gate contacts 142A, 142B may be formed by, for example, etching a trench (not shown) in dielectric layer 146 to expose gate 144A, 144B of each transistor 132A, 132B, and filling the trench, e.g., by deposition, with a conductive metal and planarizing the conductive metal. Optionally, a conductive liner can be deposited within the trench before deposition of the conductive metal so that the trench is lined with the conductive metal.

Further, another dielectric layer 148 may be formed, e.g., by deposition, over crystalline silicon layer 126 and over semiconductor layer 136, or more specifically, over dielectric layer 146. Dielectric layer 148 may at least one of: an oxide, e.g., silicon oxide, or a nitride, e.g., silicon nitride.

Additionally, vias 152A, 152B may be formed within dielectric layer 148 to provide connection between a respective transistor 132A, 132B of the plurality of active devices 132 and a wiring layer 156 formed over semiconductor layer 136 and dielectric layer 148. Vias 152A, 152B can include a metal resistant to high temperature, such as, for example, at least one of: tungsten, cobalt, rhodium, iridium, nickel, ruthenium, tantalum, niobium, graphite, or platinum. Vias 152A, 152B may each be formed by etching a trench (not shown) within dielectric layer 148 and semiconductor layer 136 to expose gate contacts 142A, 142B. The trench may be filled with the metal resistant to high temperature. Additionally, the metal resistant to high temperature may be planarized to a top surface of dielectric layer 148.

Wiring layer 156 may be formed, e.g., via deposition, over semiconductor layer 136, or more specifically, over dielectric layer 148, and over vias 152A, 152B such that wiring layer 156 is electrically connected to vias 152A, 152B. In another embodiment, wiring layer 156 may be formed at the same time as vias 152A, 152B, and therefore, in some embodiments, may be composed of the same material as the material used for vias 152A, 152B. Thus, wiring layer 156 may also include a metal resistant to high temperature such as, for example, at least one of: tungsten, cobalt, rhodium, iridium, nickel, ruthenium, tantalum, niobium, graphite, or platinum. Further, an anneal may be performed after the formation of vias 152A, 152B and/or after formation of wiring layer 156 to activate plurality of active devices 132. Since vias 152A, 152B and wiring layer 156 are composed of metal resistant to high temperature, vias 152A, 152B and wiring layer 156 are not damaged during the anneal that activates plurality of active devices 132. That is, in contrast to conventional contacts and wiring layers which use, copper, the present disclosure provides for the use of a metal resistant to high temperatures, e.g., tungsten. Thus, the activation anneal(s) can occur without regard to limitations on temperatures that could damage vias 152A, 152B and wiring layer 156. Due to the higher melting points of the high temperature resistant metal, the temperature and time constraints on the anneal used to activate plurality of active devices 132 are reduced and the anneal can be performed at higher temperatures and for longer durations without damaging contacts 152A, 152B and wiring layer 156. Temperatures, therefore, can exceed those that would normally damage BEOL interconnect structures, e.g., they may exceed 900° C. and even exceed 1000° C. In contrast to conventional techniques, no shielding layers are necessary to perform the anneals, thus saving on costs and process time.

After forming wiring layer 156, a dielectric layer 162 may be formed over wiring layer 156. Dielectric layer 162 may include any of the dielectric layer materials discussed herein. Further, a crystalline silicon layer 164 may be formed over dielectric layer 162. Dielectric layer 162 and crystalline silicon layer 164 may each be formed by conventional deposition techniques. While only two device layers have been shown, i.e., first and second layers including active devices, it is to be understood that aspects of the disclosure are equally applicable to an IC structure including any number of device layers. In such an embodiment, the process described herein may be repeated until the number desired number of device layers is formed.

Turning now to FIG. 2, another dielectric layer 166 is formed, e.g., by deposition, over crystalline silicon layer 164. Dielectric layer 166 may include any of the dielectric layer materials discussed herein. Further, FIG. 2 also shows forming a first back-end-of-line (BEOL) interconnect structure 170 electrically coupled to at least one of second plurality of active devices 132 and at least one of first plurality of active devices 104. BEOL interconnect structure 170 may include any now known or later developed interconnect structure 170. As used herein, "BEOL interconnect structure" includes any interconnect layers formed over semiconductor substrate 102 in the course of device manufacturing following first metallization, and may include any structure considered BEOL or far BEOL (FBEOL) in the industry.

BEOL interconnect structure 170 may be formed using any now known or later developed semiconductor fabrication techniques, e.g., dielectric layer deposition, photolithographic patterning of wire/via openings, deposition of conductors (perhaps with liners), planarization, etc. As will be described herein, each BEOL interconnect structure 170 layer may include metal wires (extending across layers) and/or vias (extending vertically between metal wires) formed on or within a dielectric layer, e.g., dielectric layer 166.

In one embodiment, as part of BEOL interconnect structure 170 formation, a TSV 172 may be formed to electrically couple wiring layer 120 and a BEOL metallization (wire) 174 after formation of IC structure 100 (FIG. 1). TSVs are vertically extending interconnects that passes through silicon. In an alternative embodiment, TSV 172 may be formed partially during the formation of insulator layers 124, 162, crystalline silicon layers 126, 164, wiring layer 156, and dielectric layers 148, 166. TSV 172 may include, for example, a refractory metal liner and a conductive metal, such as copper.

Still referring to FIG. 2, another TSV 176 may be formed to electrically couple wiring layer 156 and BEOL metallization 174 (wire) after formation of IC structure 100 (FIG. 1). In an alternative embodiment, TSV 176 may be formed partially during the formation of insulator layers 124, 162, crystalline silicon layers 126, 164, wiring layer 156, and dielectric layers 148, 166. TSV 176 may include, for example, an optional refractory metal liner and a conductive metal, such as copper.

After formation of TSVs 172, 176, BEOL metallization (wire) 174 may be formed over dielectric layer 166 and TSVs 172, 176. BEOL metallization (wire) 174 may be formed by conventional deposition, patterning, and etching of the material used for TSVs 172, 176. That is, BEOL metallization (wire) 174 may include an optional refractory metal liner and a conductive metal, such as copper. In some embodiments, BEOL metallization (wire) 174 and TSVs 172, 176 may be formed together, at the same time. BEOL metallization (wire) 174 may be electrically connected to first plurality of active devices 104 through TSV 172, wiring layer 120, and vias 118A, 118B. BEOL metallization 174 (wire) may be electrically connected to second plurality of active devices 132 through TSV 176, wiring layer 156, and contacts 152A, 152B. As shown in FIG. 2, TSVs 172, 176 may be staggered with respect to each other. As used herein, "staggered" refers to the position of one reference structure being laterally offset from another reference structure.

The methodology also allows formation of IC structure 190 without the concerns of damaging BEOL layers with activation anneals because the BEOL interconnect structures are not present at the time of the anneal(s). Thus, no shielding layers are required, saving on costs and process time. The methodology also advantageously does not present a large disruption to current packaging technologies.

Figure 3:
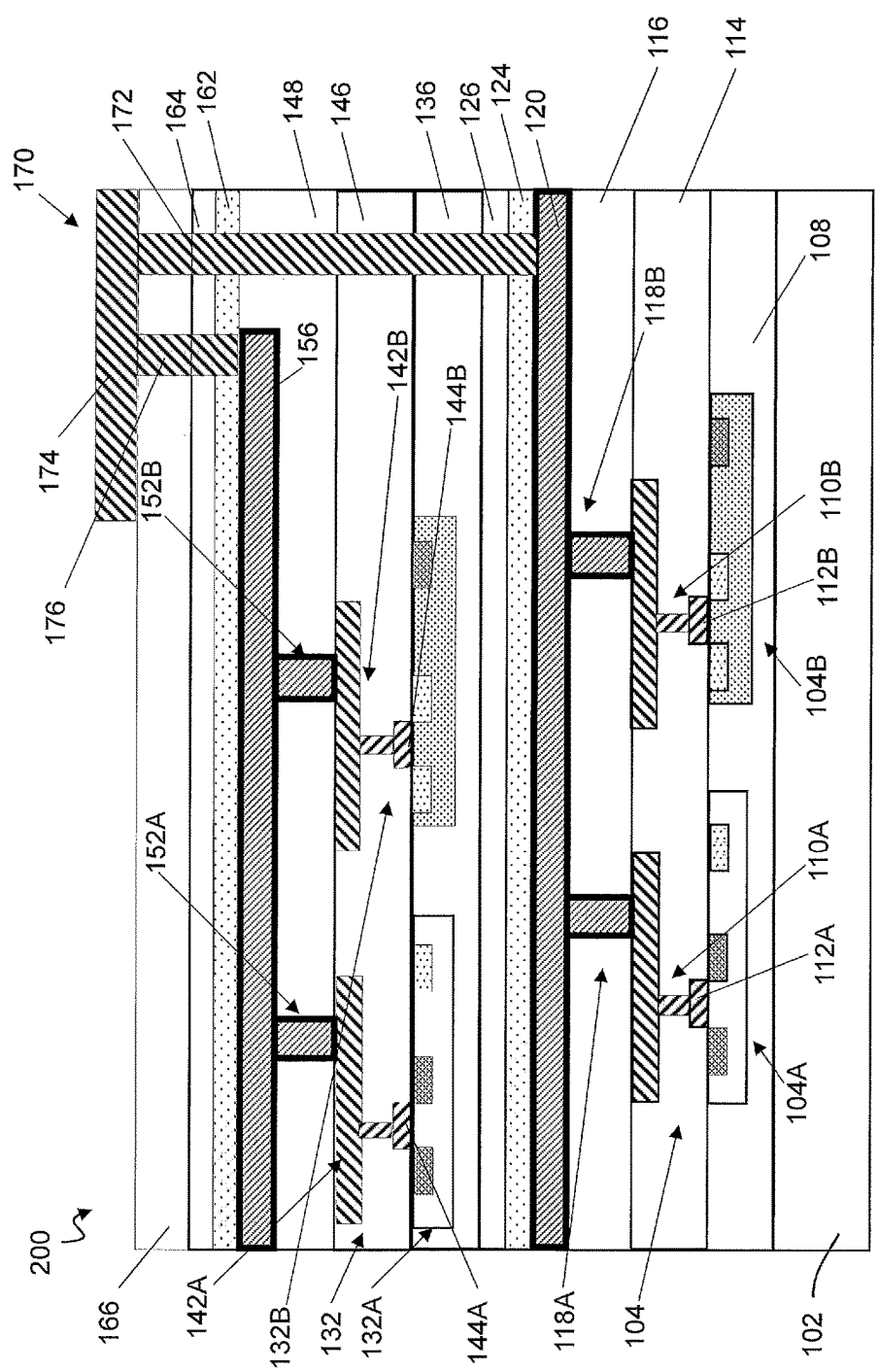
FIG. 3 show a resulting IC structure according to another embodiment of the disclosure.

FIG. 3 shows an IC structure 200 according to another embodiment of the disclosure wherein like numbering represents like elements of IC structures 100, 190. In this embodiment, first plurality of active devices 104 and second plurality of active devices 132 are staggered with respect to one another such that first plurality of active devices 104 is laterally offset from second plurality of active devices 132. This orientation may be accomplished by conventional masking techniques.

Figure 4:
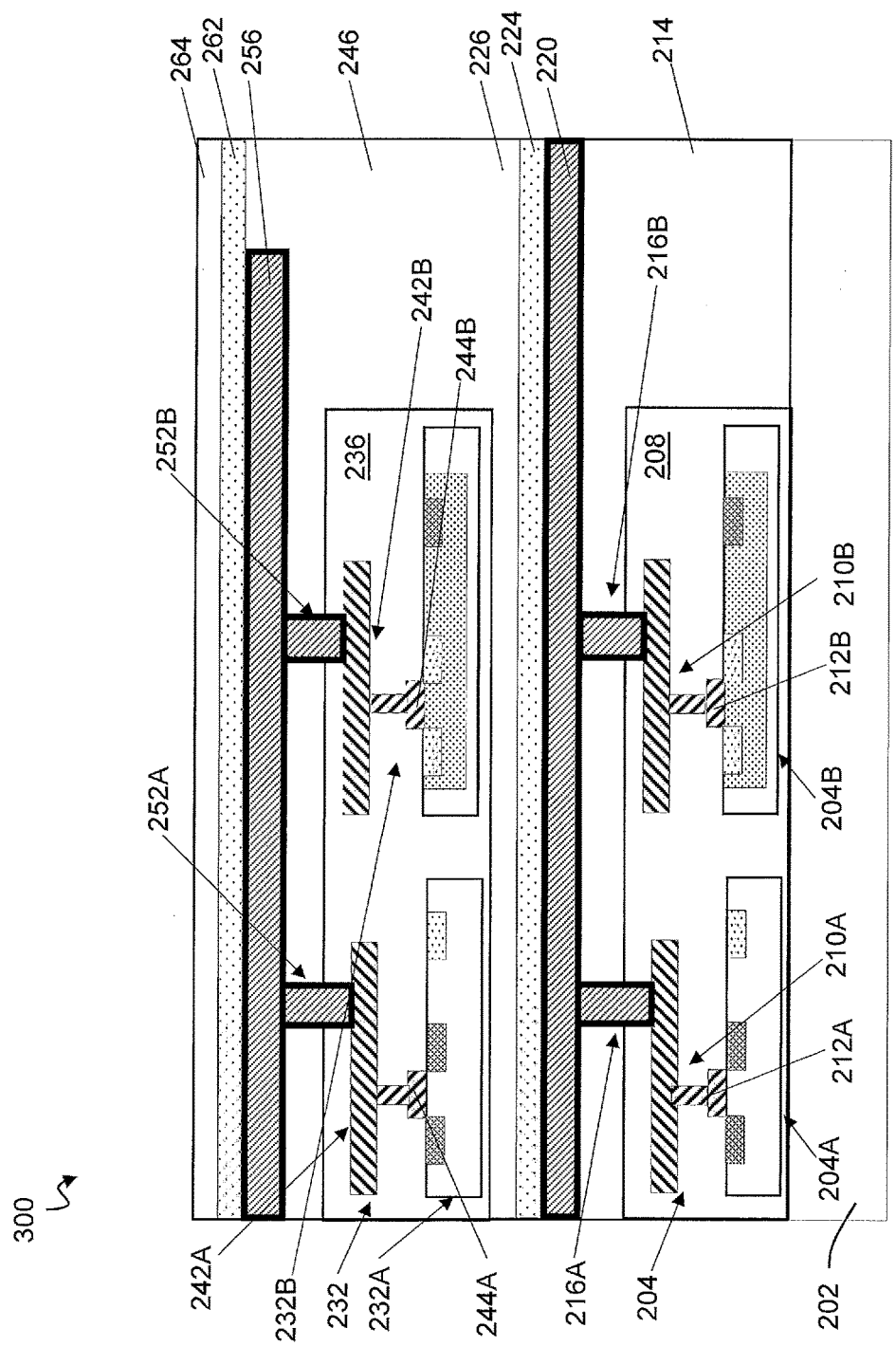
FIGS. 4-5 show cross-sectional views of steps of a method of forming an IC structure according to embodiments of the disclosure, with FIG. 5 showing the resulting IC structure according to embodiments of the disclosure.

FIG. 4 shows another embodiment of the disclosure. FIG. 4 shows a preliminary IC structure 300 including a semiconductor substrate 202 upon which fabrication of active devices according to embodiments of the disclosure will be fabricated. Semiconductor substrate 202 may include any of the substrate materials discussed herein. While substrate 202 includes a single layer of semiconductor material, it is emphasized that the teachings of the disclosure are equally applicable to semiconductor-on-insulator (SOI) substrates.

FIG. 4 also shows forming a first plurality of active devices 204 on semiconductor substrate 202. Active devices 204 may include any now known or later developed semiconductor device such as but not limited to: transistors and other logic structures, memory cells, resistors, etc. As illustrated, one active device 204A includes an n-type field effect transistor (NFET) and another active device 204B includes a p-type field effect transistor (PFET). While two transistors 204A, 204B have been illustrated, it is understood that a large number of transistors or other active devices may be formed without departing from aspects of the disclosure described herein. With the exception of when activation anneal(s) are performed, transistors 204A, 204B or other active devices may be formed on substrate 202 using any now known or later developed semiconductor fabrication techniques, e.g., deposition, photolithographic patterning, etching, planarization, dopant implants, etc. Transistors 204A, 204B are shown formed in an epitaxial semiconductor layer 208 atop substrate 202 according to conventional processes FEOL processing, but may be formed in a variety of alternative fashions on or within substrate 202.

Still referring to FIG. 4, a dielectric layer 214 may be formed, e.g., deposited, over semiconductor layer 208. Dielectric layer 214 may include, for example, at least one of: an oxide, e.g., silicon oxide, or a nitride, e.g., silicon nitride. Active gates 212A, 212B and contacts, such as gate contacts 210A, 210B, may be formed through dielectric layer 214 to a gate 212A, 212B of each transistor 204A, 204B, respectively. Gate contacts 110A, 210B may be formed by, for example, etching a trench (not shown) in dielectric layer 114 to expose gate 212A, 212B of each transistor 204A, 204B, and filling the trench, e.g., by deposition, with a conductive metal and planarizing the conductive metal. Optionally, a conductive liner can be deposited within the trench before deposition of the conductive metal so that the trench is lined with the conductive metal.

Additionally, vias 216A, 216B may be formed within dielectric layer 214 and to provide connection between a respective transistor 204A, 204B of the plurality of active devices 204 and a wiring layer 220 formed over semiconductor layer 208. More specifically, vias 216A, 216B may provide connection between contacts 210A, 210B and wiring layer 220. Vias 216A, 216B can include a metal resistant to high temperature. The metal that is resistant to high temperature may include, for example, at least one of: tungsten, cobalt, rhodium, iridium, nickel, ruthenium, tantalum, niobium, graphite, or platinum. Vias 216A, 216B can be formed by etching a trench (not shown) within dielectric layer 214 to expose gate contacts 210A, 210B. The trench may be filled with the metal resistant to high temperature. Additionally, the metal resistant to high temperature may be planarized to a top surface of dielectric layer 214.

Wiring layer 220 may be formed, e.g., via deposition, over semiconductor layer 208, or more specifically, over dielectric layer 214, and over vias 216A, 216B such that wiring layer 220 is electrically connected to vias 216A, 216B. In another embodiment, wiring layer 220 may be formed at the same time as vias 216A, 216B, and therefore, in some embodiments, may be composed of the same material as the material used for vias 216A, 118B. Thus, wiring layer 220 may also include a metal resistant to high temperature such as, for example, at least one of: tungsten, cobalt, rhodium, iridium, nickel, ruthenium, tantalum, niobium, graphite, or platinum. Further, an anneal may be performed after the formation of vias 216A, 216B and/or after formation of wiring layer 220 to activate plurality of active devices 204. Since vias 216A, 216B and wiring layer 220 are composed of metal resistant to high temperature, vias 216A, 216B and wiring layer 220 are not damaged during the anneal that activates plurality of active devices 204. That is, in contrast to conventional contacts and wiring layers which use, copper, the present disclosure provides for the use of a metal resistant to high temperatures, e.g., tungsten. Thus, the activation anneal(s) can occur without regard to limitations on temperatures that could damage vias 216A, 216B and wiring layer 220. Due to the higher melting points of the high temperature resistant metal, the temperature and time constraints on the anneal used to activate plurality of active devices 204 are reduced and the anneal can be performed at higher temperatures and for longer durations without damaging vias 216A, 216B and wiring layer 220. Temperatures, therefore, can exceed those that would normally damage BEOL interconnect structures, e.g., they may exceed 900° C. and even exceed 1000° C. In contrast to conventional techniques, no shielding layers are necessary to perform the anneals, thus saving on costs and process time.

After forming wiring layer 220, a dielectric layer 224 may be formed over wiring layer 220. Dielectric layer 224 may include any appropriate interlayer dielectric material such as but not limited to: silicon nitride ($Si_3N_4$) or silicon oxide ($SiO_2$). Further, a crystalline silicon layer 226 may be formed over dielectric layer 224. Dielectric layer 224 and crystalline silicon layer 226 may each be formed by conventional deposition techniques.

Still referring to FIG. 4, the process described herein may be repeated to form a second layer having a second plurality of active devices over semiconductor layer 208 including first active devices 204 to create a stacked IC structure 300. For example, a second plurality of active devices 232 may be formed according to conventional processes FEOL processing within another epitaxial semiconductor layer 236 over crystalline silicon layer 226. Active devices 232 may include any now known or later developed semiconductor device such as but not limited to: transistors and other logic structures, memory cells, resistors, etc. As illustrated, one active device 232A includes an NFET and another active device 232B includes a PFET. While two transistors 232A, 232B have been illustrated, it is understood that a large number of transistors or other active devices may be formed without departing from aspects of the disclosure described herein. With the exception of when activation anneal(s) are performed according to embodiments of the disclosure, transistors 232A, 232B or other active devices may be formed using any now known or later developed semiconductor fabrication techniques, e.g., deposition, photolithographic or sidewall transfer patterning, etching, planarization, dopant implants, etc. Transistors 232A, 232B are shown formed in an epitaxial semiconductor layer 236 atop crystalline silicon layer 226, but may be formed in a variety of alternative fashions.

First plurality of active devices 204 and second plurality of active devices 232 do not need to be identical, and may be different in size (e.g., 22 nm versus 10 nm) and/or type, i.e., different active devices such as transistors and memory cells. That is, first plurality of active devices 204 may have at least one of a different size and a different type than second plurality of active devices 232.

Still referring to FIG. 4, a dielectric layer 246 may be formed, e.g., deposited over semiconductor layer 236. Dielectric layer 246 may include, for example, at least one of: an oxide, e.g., silicon oxide, or a nitride, e.g., silicon nitride. Active gates 244A, 244B and contacts, such as gate contacts 242A, 242B, may be formed to a gate 244A, 244B of each transistor 232A, 232B, respectively. Gate contacts 242A, 242B may be formed by, for example, etching a trench (not shown) in dielectric layer 246 to expose gate 244A, 244B of each transistor 232A, 232B, and filling the trench, e.g., by deposition, with a conductive metal and planarizing the conductive metal. Optionally, a conductive liner can be deposited within the trench before deposition of the conductive metal so that the trench is lined with the conductive metal.

Additionally, vias 252A, 252B may be formed within dielectric layer 246 to provide connection between a respective transistor 232A, 232B of the plurality of active devices 232 and a wiring layer 256 formed over semiconductor layer 236 and dielectric layer 246. Vias 252A, 252B can include a metal resistant to high temperature, such as, for example, at least one of: tungsten, cobalt, rhodium, iridium, nickel, ruthenium, tantalum, niobium, graphite, or platinum. Vias 252A, 252B may each be formed by etching a trench (not shown) within dielectric layer 246 and semiconductor layer 236 to expose gate contacts 242A, 242B. The trench may be filled with the metal resistant to high temperature. Additionally, the metal resistant to high temperature may be planarized to a top surface of dielectric layer 246.

Wiring layer 256 may be formed, e.g., via deposition, over semiconductor layer 236, or more specifically, over dielectric layer 246, and over vias 252A, 252B such that wiring layer 256 is electrically connected to vias 252A, 252B. In another embodiment, wiring layer 256 may be formed at the same time as vias 252A, 252B, and therefore, in some embodiments, may be composed of the same material as the material used for vias 252A, 252B. Thus, wiring layer 256 may also include a metal resistant to high temperature such as, for example, at least one of: tungsten, cobalt, rhodium, iridium, nickel, ruthenium, tantalum, niobium, graphite, or platinum. Further, an anneal may be performed after the formation of vias 252A, 252B and/or after formation of wiring layer 256 to activate plurality of active devices 232. Since vias 252A, 252B and wiring layer 256 are composed of metal resistant to high temperature, vias 252A, 252B and wiring layer 256 are not damaged during the anneal that activates plurality of active devices 232. That is, in contrast to conventional contacts and wiring layers which use, copper, the present disclosure provides for the use of a metal resistant to high temperatures, e.g., tungsten. Thus, the activation anneal(s) can occur without regard to limitations on temperatures that could damage vias 252A, 252B and wiring layer 256. Due to the higher melting points of the high temperature resistant metal, the temperature and time constraints on the anneal used to activate plurality of active devices 232 are reduced and the anneal can be performed at higher temperatures and for longer durations without damaging contacts 252A, 252B and wiring layer 256. Temperatures, therefore, can exceed those that would normally damage BEOL interconnect structures, e.g., they may exceed 900° C. and even exceed 1000° C. In contrast to conventional techniques, no shielding layers are necessary to perform the anneals, thus saving on costs and process time.

After forming wiring layer 256, a dielectric layer 262 may be formed over wiring layer 256. Dielectric layer 262 may include any of the dielectric layer materials discussed herein. Further, a crystalline silicon layer 264 may be formed over dielectric layer 262. Dielectric layer 262 and crystalline silicon layer 264 may each be formed by conventional deposition techniques. While only two device layers have been shown, i.e., first and second layers including active devices, it is to be understood that aspects of the disclosure are equally applicable to an IC structure including any number of device layers. In such an embodiment, the process described herein may be repeated until the number desired number of device layers is formed.

Figure 5:
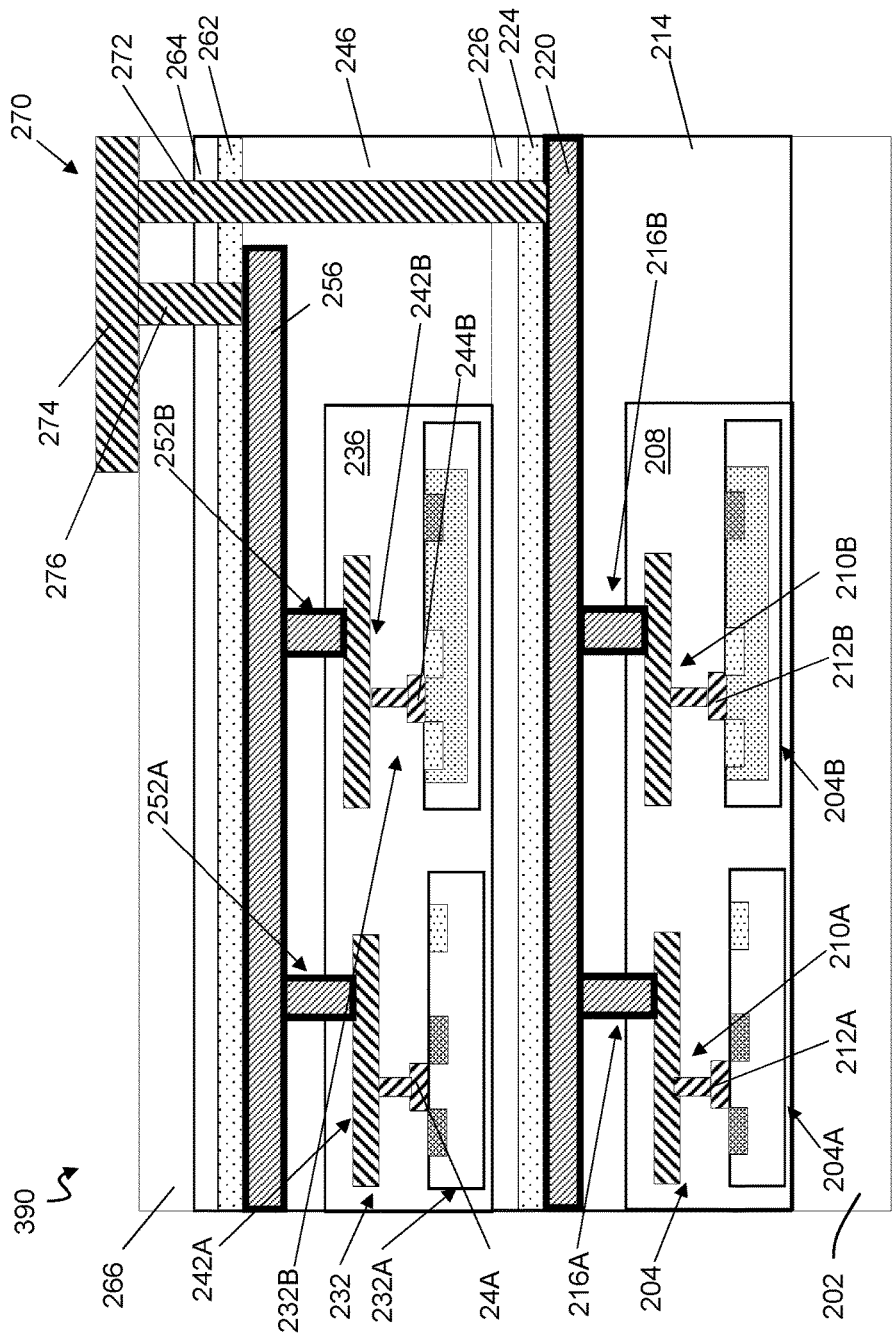

Turning now to FIG. 5, another dielectric layer 266 is formed, e.g., by deposition, over crystalline silicon layer 264. Dielectric layer 266 may include any of the dielectric layer materials discussed herein. Further, FIG. 5 also shows forming a first back-end-of-line (BEOL) interconnect structure 270 electrically coupled to at least one of second plurality of active devices 232 and at least one of first plurality of active devices 204. BEOL interconnect structure 270 may include any now known or later developed interconnect structure 270. As used herein, "BEOL interconnect structure" includes any interconnect layers formed over semiconductor substrate 202 in the course of device manufacturing following first metallization, and may include any structure considered BEOL or far BEOL (FBEOL) in the industry.

BEOL interconnect structure 270 may be formed using any now known or later developed semiconductor fabrication techniques, e.g., dielectric layer deposition, photolithographic patterning of wire/via openings, deposition of conductors (perhaps with liners), planarization, etc. As will be described herein, each BEOL interconnect structure 270 layer may include metal wires (extending across layers) and/or vias (extending vertically between metal wires) formed on or within a dielectric layer, e.g., dielectric layer 266.

In one embodiment, as part of BEOL interconnect structure 270 formation, a TSV 272 may be formed to electrically couple wiring layer 220 and a BEOL metallization (wire) 274 after formation of IC structure 300 (FIG. 4). TSVs are vertically extending interconnects that passes through silicon. In an alternative embodiment, TSV 272 may be formed partially during the formation of insulator layers 224, 262, crystalline silicon layers 226, 264, wiring layer 256, and dielectric layers 246, 266. TSV 272 may include, for example, a refractory metal liner and a conductive metal, such as copper.

Still referring to FIG. 5, another TSV 276 may be formed to electrically couple wiring layer 256 and BEOL metallization 274 (wire) after formation of IC structure 300 (FIG. 4). In an alternative embodiment, TSV 276 may be formed partially during the formation of insulator layers 224, 262, crystalline silicon layers 226, 264, wiring layer 256, and dielectric layers 246, 266. TSV 276 may include, for example, an optional refractory metal liner and a conductive metal, such as copper.

After formation of TSVs 272, 276, BEOL metallization (wire) 274 may be formed over dielectric layer 266 and TSVs 272, 276. BEOL metallization (wire) 274 may be formed by conventional deposition, patterning, and etching of the material used for TSVs 272, 276. That is, BEOL metallization (wire) 274 may include an optional refractory metal liner and a conductive metal, such as copper. In some embodiments, BEOL metallization (wire) 274 and TSVs 272, 276 may be formed together, at the same time. BEOL metallization (wire) 274 may be electrically connected to first plurality of active devices 204 through TSV 272, wiring layer 220, and vias 218A, 218B. BEOL metallization 274 (wire) may be electrically connected to second plurality of active devices 232 through TSV 276, wiring layer 256, and contacts 252A, 252B. As shown in FIG. 5, TSVs 272, 276 may be staggered with respect to each other. As used herein, "staggered" refers to the position of one reference structure being laterally offset from another reference structure.

The methodology also allows formation of IC structure 390 without the concerns of damaging BEOL layers with activation anneals because the BEOL interconnect structures are not present at the time of the anneal(s). Thus, no shielding layers are required, saving on costs and process time. The methodology also advantageously does not present a large disruption to current packaging technologies.

Figure 6:
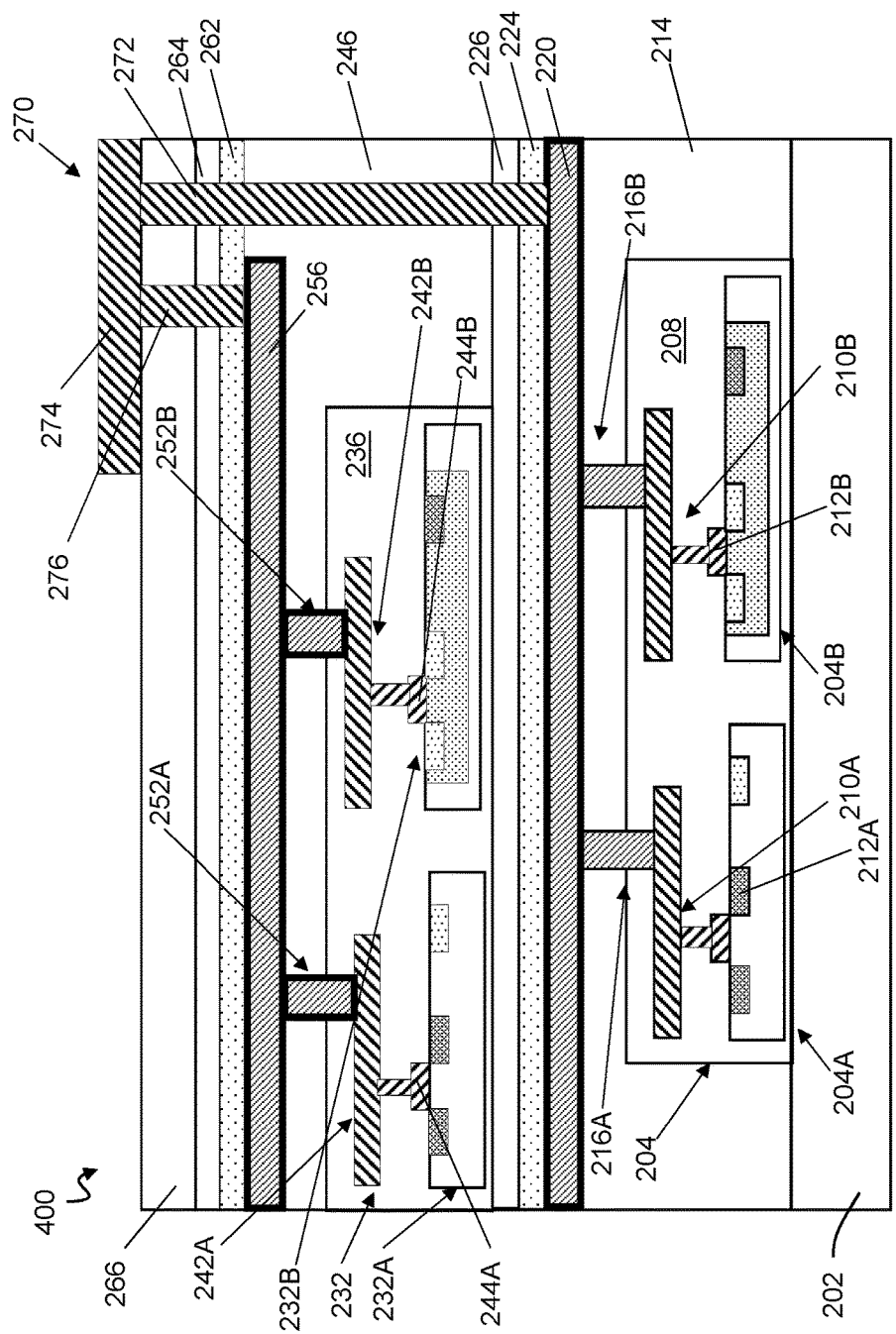
FIG. 6 shows a resulting IC structure according to another embodiment of the disclosure.

FIG. 6 shows an IC structure 400 according to another embodiment of the disclosure wherein like numbering represents like elements of IC structures 300, 390. In this embodiment, first plurality of active devices 204 and second plurality of active devices 232 are staggered with respect to one another such that first plurality of active devices 204 is laterally offset from second plurality of active devices 232. This orientation may be accomplished by conventional masking techniques The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately" and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC) structure, comprising:
    a first layer including a first plurality of active devices in a first semiconductor layer over a substrate;
    a first wiring layer over the first layer;
    a second layer including a second plurality of active devices within a second semiconductor layer over the first wiring layer; and
    a second wiring layer over the second layer, wherein the first wiring layer and the second wiring layer each includes a first metal having a melting point greater than approximately 1400 degrees Celsius (° C.).

2. The IC structure of claim 1, further comprising:
    a back-end-of-the-line (BEOL) metallization over the second wiring layer;
    a first through silicon via (TSV) extending from the BEOL metallization to the first wiring layer; and
    a second TSV extending from the BEOL metallization to the second wiring layer.

3. The IC structure of claim 2, wherein the first TSV and the second TSV are in a staggered formation with respect to each other.

4. The IC structure of claim 2, wherein the first TSV and the second TSV each includes copper.

5. The IC structure of claim 1, further comprising:
    an insulator layer over the first wiring layer and a crystalline silicon layer over the insulator layer below the second wiring layer.

6. The IC structure of claim 1, wherein the first plurality of active devices is staggered with respect to the second plurality of active devices.

7. The IC structure of claim 1, wherein the first metal includes at least one of: tungsten, cobalt, rhodium, iridium, nickel, ruthenium, tantalum, niobium, graphite, or platinum.

8. The IC structure of claim 1, further comprising:
    a first plurality of vias within the first layer, each via of the first plurality of vias connecting a portion of a respective active device of the first plurality of active devices to the first wiring layer; and
    a second plurality of vias within the second layer, each via of the second plurality of vias connecting a portion of a respective active device of the second plurality of active devices to the second wiring layer,
    wherein each via of the first plurality of vias and the second plurality of vias includes a second metal having a melting point greater than approximately 1400° C.

9. The IC structure of claim 8, wherein the second metal resistant to high temperature includes at least one of: tungsten, cobalt, rhodium, iridium, nickel, ruthenium, tantalum, niobium, graphite, or platinum.

10. An integrated circuit (IC) structure, comprising:
    a first layer including a first plurality of active devices in a first semiconductor layer over a substrate;
    a first wiring layer over the first layer including a first metal resistant to high temperature;
    a second layer including a second plurality of active devices within a second semiconductor layer over the first wiring layer;
    a second wiring layer over the second layer including the first metal having a melting point greater than approximately 1400 degrees Celsius (° C.),
    wherein the first metal resistant to high temperature includes at least one of: tungsten, cobalt, rhodium, iridium, nickel, ruthenium, tantalum, niobium, graphite, or platinum;
    a back-end-of-the-line (BEOL) metallization over the second wiring layer;
    a first through silicon via (TSV) extending from the BEOL metallization to the first wiring layer; and
    a second TSV extending from the BEOL metallization to the second wiring layer.

11. The IC structure of claim 10, wherein the first TSV and the second TSV each includes copper.

12. The IC structure of claim 10, further comprising:
    a first insulator layer over the first wiring layer and below the second wiring layer;
    a first crystalline silicon layer between the first insulator layer and the second wiring layer;
    a second insulator layer over the second wiring layer and below the BEOL metallization; and
    a second crystalline silicon layer between the second insulator layer and the BEOL metallization.

13. The IC structure of claim 10, wherein the first plurality of active devices is staggered with respect to the second plurality of active devices.

* * * * *